United States Patent
Goto

(10) Patent No.: US 8,953,078 B2
(45) Date of Patent: Feb. 10, 2015

(54) SOLID-STATE IMAGING DEVICE AND IMAGING APPARATUS

(71) Applicant: Fujifilm Corporation, Tokyo (JP)

(72) Inventor: Takashi Goto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/034,438

(22) Filed: Sep. 23, 2013

(65) Prior Publication Data

US 2014/0022432 A1 Jan. 23, 2014

Related U.S. Application Data

(63) Continuation of application No. PCT/JP2011/076557, filed on Nov. 17, 2011.

(30) Foreign Application Priority Data

Mar. 28, 2011 (JP) .................................. 2011-070944
May 10, 2011 (JP) .................................. 2011-105332

(51) Int. Cl.
*H04N 3/14* (2006.01)
*H04N 5/335* (2011.01)
(Continued)

(52) U.S. Cl.
CPC ........ *H04N 5/3745* (2013.01); *H01L 27/14609* (2013.01); *H01L 27/14632* (2013.01); *H01L 27/14643* (2013.01); *H04N 5/361* (2013.01); *H04N 5/374* (2013.01)
USPC .......................................... 348/308; 348/302

(58) Field of Classification Search
CPC ..... H04N 5/374; H04N 5/3742; H04N 5/376; H04N 5/3765; H04N 5/37452; H04N 5/3559
USPC .................................. 348/302, 308
See application file for complete search history.

(56) References Cited

U.S. PATENT DOCUMENTS

2005/0206766 A1 9/2005 Suzuki
2007/0057339 A1 3/2007 Mitsui et al.
(Continued)

FOREIGN PATENT DOCUMENTS

JP 2005-268477 A 9/2005
JP 2007-081137 A 3/2007
(Continued)

OTHER PUBLICATIONS

International Search Report; PCT/JP2011/076557; Dec. 13, 2011.
(Continued)

*Primary Examiner* — Nelson D. Hernández Hernández
(74) *Attorney, Agent, or Firm* — Studebaker & Brackett PC

(57) ABSTRACT

The invention is directed to a solid-state imaging device in which pixels each including a photoelectric conversion portion formed above a semiconductor substrate and an MOS type signal reading circuit formed at the semiconductor substrate and provided for reading out a signal corresponding to electric charges generated in the photoelectric conversion portion are disposed in an array form, wherein: the photoelectric conversion portion includes a pixel electrode, a counter electrode and a photoelectric conversion layer as defined herein; a bias voltage is applied to the counter electrode as defined herein; the signal reading circuit includes a charge storage portion, an output transistor and a reset transistor as defined herein; the charge storage portion includes a first charge storage region, a second charge storage region and a separation/connection region as defined herein; and the output transistor outputs a signal corresponding to the potential of the second charge storage region.

16 Claims, 13 Drawing Sheets

(51) Int. Cl.
*H04N 5/3745* (2011.01)
*H01L 27/146* (2006.01)
*H04N 5/361* (2011.01)
*H04N 5/374* (2011.01)

(56) References Cited

U.S. PATENT DOCUMENTS

2009/0153716 A1  6/2009 Ota
2010/0245641 A1  9/2010 Takata
2013/0313410 A1* 11/2013 Goto .......................... 250/208.1

FOREIGN PATENT DOCUMENTS

JP  2009-147067 A  7/2009
JP  2010-233096 A  10/2010

OTHER PUBLICATIONS

Written Opinion of the International Searching Authority; PCT/JP2011/076557; Dec. 13, 2011.

* cited by examiner (g)

SOLID-STATE IMAGING DEVICE AND IMAGING APPARATUS

CROSS REFERENCE TO RELATED APPLICATION

This is a continuation of International Application No. PCT/JP2011/076557 filed on Nov. 17, 2011, and claims priority from Japanese Patent Application No. 2011-070944 filed on Mar. 28, 2011 and Japanese Patent Application No. 2011-105332 filed on May 10, 2011, the entire disclosures of which are incorporated herein by reference.

TECHNICAL FIELD

The present invention relates to a solid-state imaging device and an imaging apparatus.

BACKGROUND ART

In order to support higher sensitivity of a solid-state imaging device and increase in number of pixels in recent years, a photoelectric conversion layer stack type solid-state imaging device having a photoelectric conversion portion which is disposed above a silicon substrate and which includes a pair of electrodes and a photoelectric conversion layer sandwiched between the pair of electrodes, has attracted attention. In the solid-state imaging device, electric charges generated in the photoelectric conversion layer are moved from one of the pair of electrodes to the silicon substrate and stored in the silicon substrate, and a signal corresponding to the stored electric charges is read out by a signal reading circuit formed in the silicon substrate (see Patent Literature 1).

Patent Literature 1 has given disclosure for a configuration in which holes of the electric charges generated in the photoelectric conversion layer above the silicon substrate are stored in a charge storage portion in the silicon substrate and a signal corresponding to the holes stored in the charge storage portion is read out by the signal reading circuit in the photoelectric conversion layer stack type solid-state imaging device. With such a configuration, sensitivity can be prevented from being lowered and spectral sensitivity can be prevented from being broadened even when an organic material is used for the photoelectric conversion layer.

PRIOR ART DOCUMENT

Patent Literature

Patent Literature 1: JP-A-2007-81137

SUMMARY OF THE INVENTION

Problems to be Solved by the Invention

According to the solid-state imaging device described in Patent Literature 1, holes generated in the photoelectric conversion layer are stored in a charge storage portion made from a p-type impurity layer in the silicon substrate and a signal corresponding to the holes is readout by a p-channel MOS transistor. Various systems can be conceived as systems for reading out a signal corresponding to the holes. For example, there may be conceived a configuration in which holes generated in the photoelectric conversion layer are stored in a charge storage portion made from an n-type impurity layer in the silicon substrate and a signal corresponding to the holes is read out by an n-channel MOS transistor. This configuration will be described below with reference to FIG. 14.

FIG. 14 is a view showing an example of a configuration of a one-pixel reading circuit in a photoelectric conversion layer stack type solid-state imaging device.

A photoelectric conversion portion above a semiconductor substrate includes a pixel electrode 1, a counter electrode 2, and a photoelectric conversion layer 3 sandwiched between the pixel electrode 1 and the counter electrode 2. A floating diffusion 4 made from an n-type impurity layer electrically connected to the pixel electrode 1, an n-channel type reset transistor 5 for resetting the potential of the floating diffusion 4, and an n-channel type output transistor 6 for outputting a voltage signal corresponding to the potential of the floating diffusion 4 are formed in the semiconductor substrate. A gate electrode of the output transistor 6 is connected to the floating diffusion 4.

A bias voltage (about 5V to 20V, for example, 10V) higher than a power supply voltage VDD (for example, 3V) supplied to the reading circuit is applied to the counter electrode 2 shown in FIG. 14. The bias voltage generates an electric field between the pixel electrode 1 and the counter electrode 2. By the electric field, holes of electric charges generated in the photoelectric conversion layer 3 are moved to the pixel electrode 1 so that the holes moved to the pixel electrode 1 are stored in the floating diffusion 4. When the holes are stored in the floating diffusion 4, the potential of the floating diffusion 4 rises.

When excessive light is incident on the photoelectric conversion layer, the potential of the floating diffusion 4 rises up to about the same level as the bias voltage applied to the counter electrode 2 at maximum. When such an overvoltage is applied to the floating diffusion 4, the floating diffusion 4 is broken so that a failure such as burn-in occurs.

Such a failure also occurs in the configuration in which electrons generated in the photoelectric conversion layer are stored in a charge storage portion made from a p-type impurity layer in the silicon substrate and a signal corresponding to the electrons is read out by a p-channel MOS transistor.

The invention has been accomplished in consideration of the aforementioned circumstances. An object of the invention is to provide a photoelectric conversion layer stack type solid-state imaging device in which there is no failure even when excessive light is incident on the solid-state imaging device, and an imaging apparatus including the photoelectric conversion layer stack type solid-state imaging device.

Means for Solving the Problems

In a solid-state imaging device of the invention, pixels each including a photoelectric conversion portion formed above a semiconductor substrate and an MOS type signal reading circuit formed at the semiconductor substrate and provided for reading out a signal corresponding to electric charges generated in the photoelectric conversion portion are disposed in an array form, wherein: the photoelectric conversion portion includes a pixel electrode formed above the semiconductor substrate so as to be split in accordance with each of the pixels, a counter electrode formed above the pixel electrode, and a photoelectric conversion layer formed between the pixel electrode and the counter electrode; a bias voltage higher than a power supply voltage of the signal reading circuit is applied to the counter electrode so that holes of the electric charges generated in the photoelectric conversion layer move to the pixel electrode; the signal reading circuit includes a charge storage portion which is formed in the semiconductor substrate and in which the holes moved to the pixel electrode are stored, an output transistor which outputs a signal corresponding to the potential of the charge storage portion, and a reset transistor which is provided for resetting the potential of the charge storage portion to a predetermined reset potential; the charge storage portion includes a first charge storage region made from an n-type impurity region electrically connected to the pixel electrode, a second charge storage region made from an n-type impurity region formed next to but spaced from the first charge storage region, and a separation/connection region which electrically separates the first charge storage region and the second charge storage region from each other when the potential is higher than a predetermined potential in a sectional potential but which electrically connects the first charge storage region and the second charge storage region to each other when the potential is not higher than the predetermined potential in the sectional potential; holes moved from the pixel electrode are stored in each of the first charge storage region, the second charge storage region and the separation/connection region till the quantity of holes moved to the pixel electrode reaches a predetermined quantity, but holes moved from the pixel electrode are stored only in the first charge storage region when the quantity of holes moved to the pixel electrode exceeds the predetermined quantity; and the output transistor outputs a signal corresponding to the potential of the second charge storage region.

In a solid-state imaging device of the invention, pixels each including a photoelectric conversion portion formed above a semiconductor substrate and an MOS type signal reading circuit formed at the semiconductor substrate and provided for reading out a signal corresponding to electric charges generated in the photoelectric conversion portion are disposed in an array form, wherein: the photoelectric conversion portion includes a pixel electrode formed above the semiconductor substrate so as to be split in accordance with each of the pixels, a counter electrode formed above the pixel electrode, and a photoelectric conversion layer formed between the pixel electrode and the counter electrode; a bias voltage lower than a reference voltage of the signal reading circuit is applied to the counter electrode so that electrons of the electric charges generated in the photoelectric conversion layer move to the pixel electrode; the signal reading circuit includes a charge storage portion which is formed in the semiconductor substrate and in which the electrons moved to the pixel electrode are stored, an output transistor which outputs a signal corresponding to the potential of the charge storage portion, and a reset transistor which is provided for resetting the potential of the charge storage portion to a predetermined reset potential; the charge storage portion includes a first charge storage region made from a p-type impurity region electrically connected to the pixel electrode, a second charge storage region made from a p-type impurity region formed next to but spaced from the first charge storage region, and a separation/connection region which electrically separates the first charge storage region and the second charge storage region from each other when the potential is lower than a predetermined potential in a sectional potential but which electrically connects the first charge storage region and the second charge storage region to each other when the potential is not lower than the predetermined potential in the sectional potential, electrons moved from the pixel electrode are stored in each of the first charge storage region, the second charge storage region and the separation/connection region till the quantity of electrons moved to the pixel electrode reaches a predetermined quantity, but electrons moved from the pixel electrode are stored only in the first charge storage region when the quantity of electrons moved to the pixel electrode exceeds the predetermined quantity; and the output transistor outputs a signal corresponding to the potential of the second charge storage region.

An imaging apparatus of the invention includes the solid-state imaging device described above.

Effects of Invention

According to the invention, it is possible to provide a photoelectric conversion layer stack type solid-state imaging device which does not fail even when excessive light is incident on the solid-state imaging device, and an imaging apparatus including the photoelectric conversion layer stack type solid-state imaging device.

EMBODIMENTS FOR CARRYING OUT THE INVENTION

An embodiment of the invention will be described below with reference to the drawings.

Figure 1:
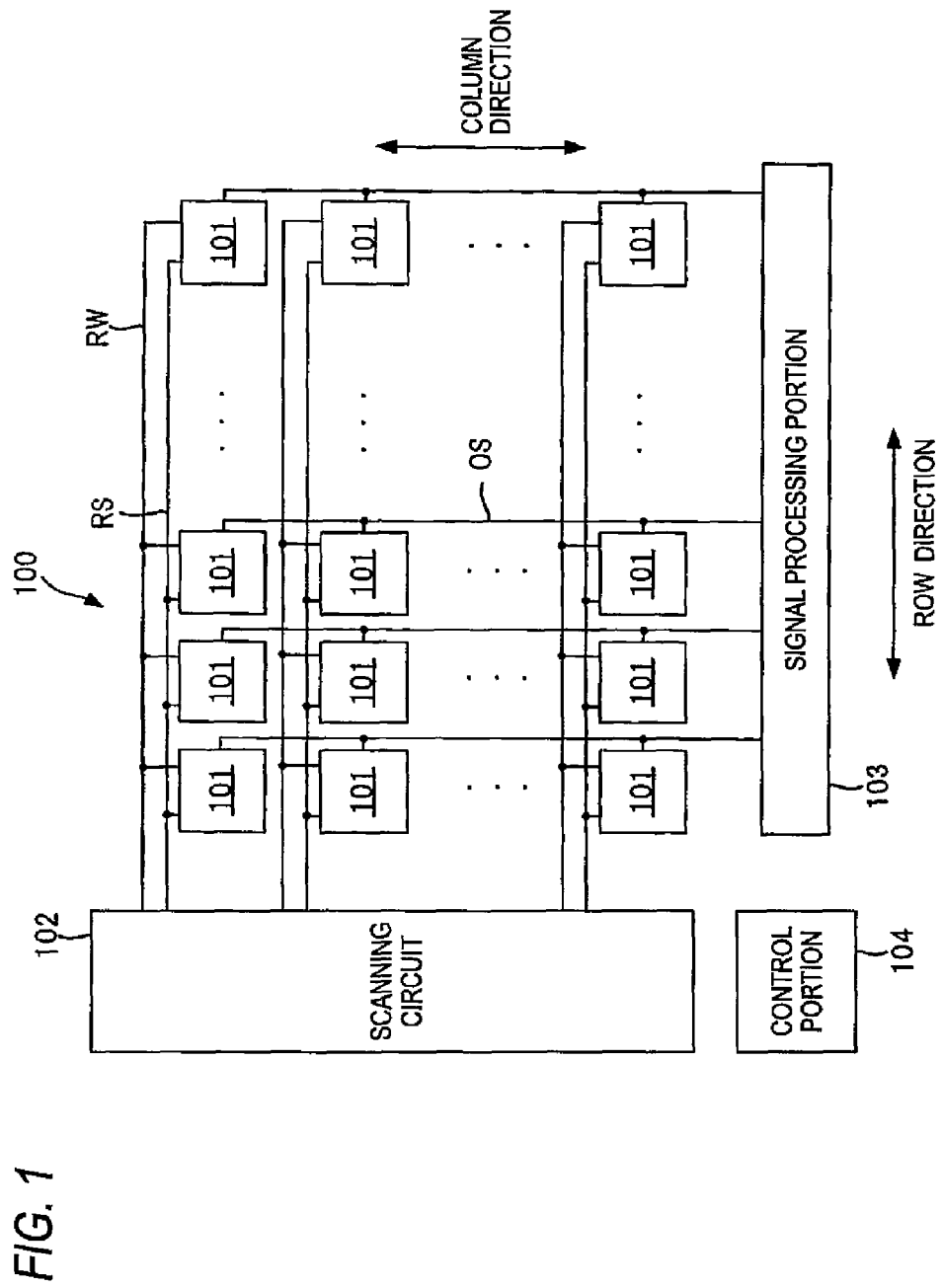
[FIG. 1] A planar schematic view of a photoelectric conversion layer stack type solid-state imaging device 100 for explaining an embodiment of the invention.

FIG. 1 is a planar schematic view of a photoelectric conversion layer stack type solid-state imaging device 100 for explaining an embodiment of the invention. In use, this solid-state imaging device 100 is mounted in imaging apparatuses such as a digital camera and a digital video camera, imaging modules mounted in an electronic endoscope and a camera-including cellular phone, etc.

The solid-state imaging device 100 shown in FIG. 1 includes a plurality of pixels 101 disposed in a two-dimensional array form in a row direction and a column direction perpendicular to the row direction (a square lattice form in an example of FIG. 1), a scanning circuit 102 for controlling reading-out of a signal from each pixel 101, a signal processing portion 103 for processing the signal outputted from each pixel 101, and a control portion 104 for generally controlling the solid-state imaging device 100.

The scanning circuit 102 is connected to a signal reading circuit which will be described later and which is included in each pixel 101 through each reset line RS and each row section line RW. The signal processing portion 103 is connected to each pixel 101 through an output signal line OS.

Figure 2:
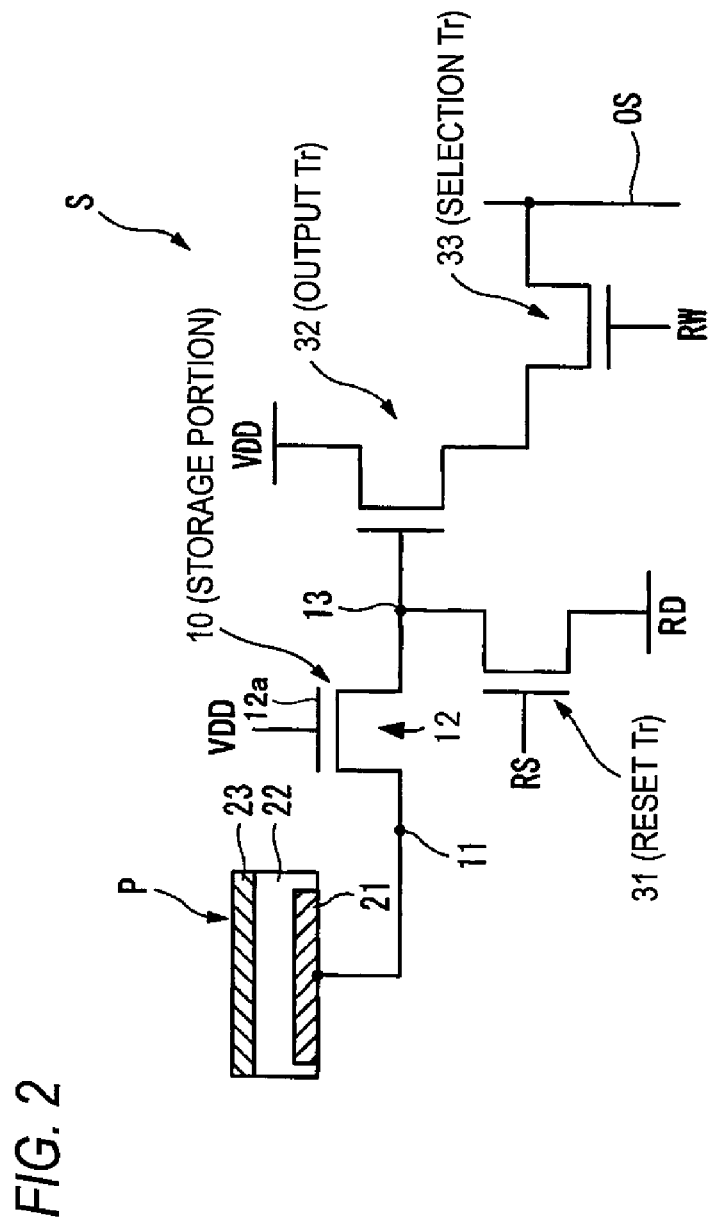
[FIG. 2] A view schematically showing a schematic configuration of a pixel 101 in the solid-state imaging device 100 shown in FIG. 1.
Figure 3:
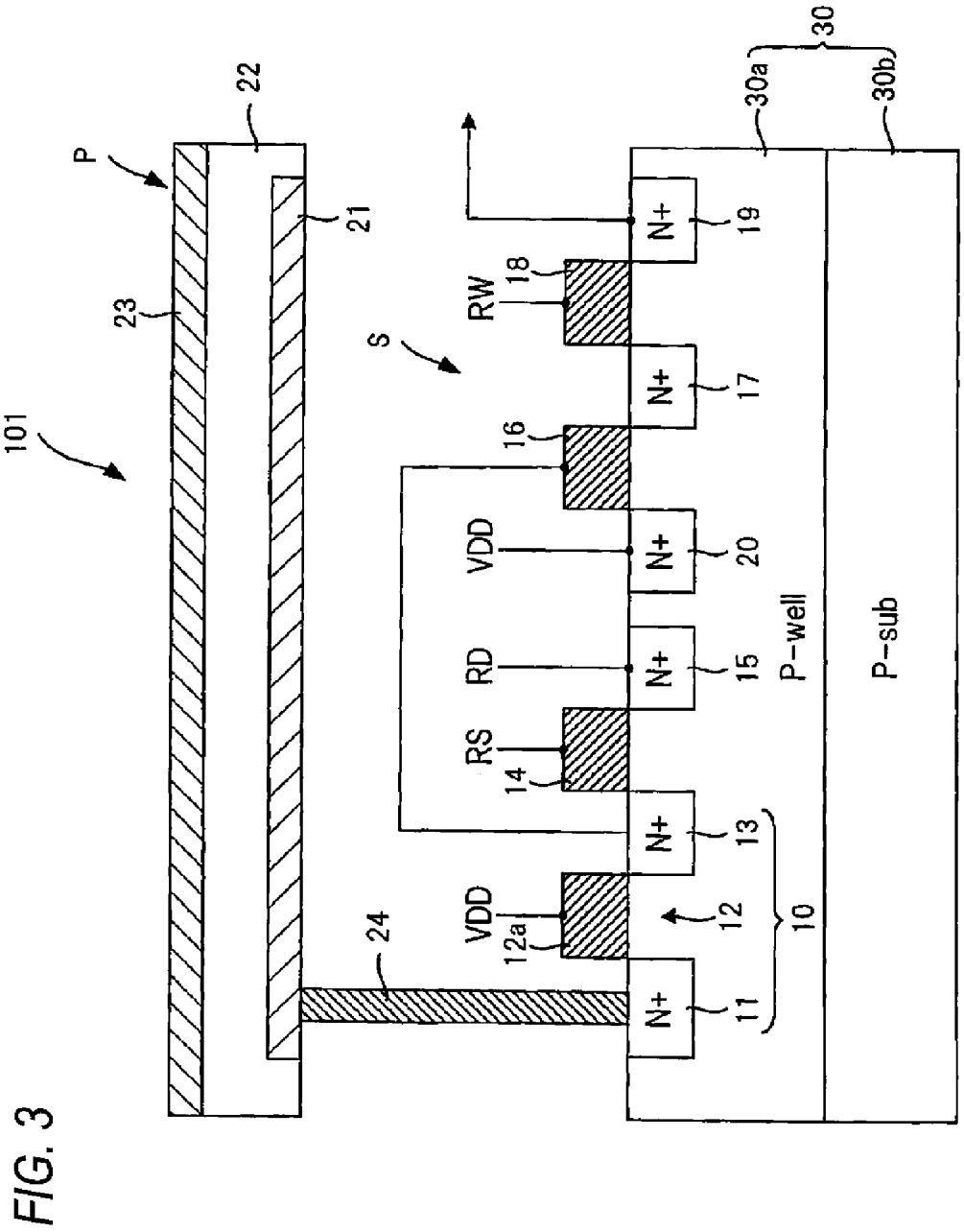
[FIG. 3] A sectional schematic view showing a schematic configuration of the pixel 101 in the solid-state imaging device 100 shown in FIG. 1.

FIG. 2 is a view schematically showing a schematic configuration of the pixel 101 in the solid-state imaging device 100 shown in FIG. 1. FIG. 3 is a sectional schematic view showing a schematic configuration of the pixel 101 in the solid-state imaging device 100 shown in FIG. 1.

As shown in FIGS. 2 and 3, the pixel 101 includes a photoelectric conversion portion P formed above a semiconductor substrate 30, and an MOS type signal reading circuit S formed at the semiconductor substrate 30. The semiconductor substrate 30 has a p-type silicon substrate 30b and a p-type well layer 30a formed on the p-type silicon substrate 30b.

The photoelectric conversion portion P includes a pixel electrode 21 formed above the semiconductor substrate 30, a counter electrode 23 formed above the pixel electrode 21, and a photoelectric conversion layer 22 provided between the pixel electrode 21 and the counter electrode 23.

Light is incident on the counter electrode 23 from above. Since light needs to be incident on the photoelectric conversion layer 22, the counter electrode 23 is made by a conductive material such as ITO transparent to the incident light. Although the counter electrode 23 is formed as one piece common to all the pixels 101, the counter electrode 23 may be split in accordance with each of the pixels 101.

The pixel electrode 21 is a thin-film electrode split in accordance with each of the pixels 101. Each pixel electrode 21 is made from a transparent or opaque conductive material (such as ITO, aluminum or titanium nitride).

The photoelectric conversion layer 22 is a layer containing an organic or inorganic photoelectric conversion material which absorbs a specific wavelength region of the incident light and generates electric charges in accordance with the quantity of the absorbed light. A charge blocking layer which suppresses injection of electric charges into the photoelectric conversion layer 22 from the electrode may be provided between the photoelectric conversion layer 22 and the counter electrode 23 or between the photoelectric conversion layer 22 and the pixel electrode 21.

A bias voltage is applied to the counter electrode 23 so that holes of the electric charges generated in the photoelectric conversion layer 22 move to the pixel electrode 21 while electrons move to the counter electrode 23. A voltage (about 5V to 20V, for example, 10V) higher than a power supply voltage VDD (for example, 3V) which is the maximum value of a voltage supplied to the signal reading circuit S is used as the bias voltage so that the photoelectric conversion layer 22 exhibits satisfactorily high sensitivity.

As shown in FIG. 2, the signal reading circuit S includes a charge storage portion 10, a reset transmitter 31 for resetting the potential of the charge storage portion 10 to a predetermined reset potential (for example, 0.5V), an output transistor 32, and a row selection transistor 33. The charge storage portion 10 includes a first charge storage region 11, a second charge storage region 13, and a separation/connection region 12 which electrically separates the first charge storage region 11 and the second charge storage region 13 from each other in a deep potential portion and which electrically connects the first charge storage region 11 and the second charge storage region 13 to each other in a shallow potential portion. Details of the signal reading circuit S will be described below with reference to FIG. 3.

As shown in FIG. 3, the first charge storage region 11 is made from an n-type impurity region formed in a surface portion of the p-type well layer 30a in the semiconductor substrate 30. The first charge storage region 11 is electrically connected to the pixel electrode 21 by a contact portion 24 made from a conductive material formed on the semiconductor substrate 30.

The second charge storage region 13 made from an n-type impurity region is formed next to but slightly spaced from the first charge storage region 11 in the p-type well layer 30a.

An electrode 12a is formed through a not-shown insulating film on the semiconductor substrate 30 between the first charge storage region 11 and the second charge storage region 13. A fixed voltage (power supply voltage VDD (for example, 3V) supplied to the signal reading circuit S in FIG. 3) is applied to the electrode 12a. The separation/connection region 12 is a region of the p-type well layer 30a overlapping with the electrode 12a. The separation/connection region 12 electrically separates the first charge storage region 11 and the second charge storage region 13 from each other when the potential is higher than a predetermined potential in the sectional potential of the semiconductor substrate 30 but the separation/connection region 12 electrically connects the first charge storage region 11 and the second charge storage region 13 to each other when the potential is not higher than the predetermined potential in the sectional potential of the semiconductor substrate 30.

An impurity region 15 made from an n-type impurity region is formed next to but slightly spaced from the second charge storage region 13 in the p-type well layer 30a. A gate electrode 14 is formed through a not-shown insulating film on the semiconductor substrate 30 between the second charge storage region 13 and the impurity region 15. The reset line RS shown in FIG. 1 is connected to the gate electrode 14. A power supply for supplying a reset voltage (for example, 0.5V) is connected to the impurity region 15. The reset transistor 31 shown in FIG. 2 is made up of the second charge storage region 13, the impurity region 15, the gate electrode 14 and a channel region under the gate electrode 14.

When a voltage to be applied to the gate electrode 14 is controlled to make the potential of the channel region of the reset transistor 31 deeper than the potential (reset potential) of the impurity region 15, electrons can be injected from the impurity region 15 into the charge storage portion 10 to reset the potential of the charge storage portion 10 to a reset potential.

An impurity region 20 made from an n-type impurity region is formed next to but slightly spaced from the semiconductor region 15 in the p-type well layer 30a. An impurity region 17 made from an n-type impurity region is formed next to but slightly spaced from the impurity region 20 in the p-type well layer 30a. A gate electrode 16 is formed through a not-shown insulating film on the semiconductor substrate 30 between the impurity region 20 and the impurity region 17. The output transistor 32 shown in FIG. 2 is made up of the impurity region 20, the impurity region 17, the gate electrode 16 and a channel region under the gate electrode 16.

The gate electrode 16 of the output transistor 32 is connected to the second charge storage region 13 by wiring. A power supply for supplying a power supply voltage VDD is connected to the impurity region 20 of the output transistor 32. The output transistor 32 outputs a signal corresponding to the potential of the second charge storage region 13 determined by the quantity of holes stored in the second charge storage region 13, to the row selection transistor 33.

An impurity region 19 made from an n-type impurity region is formed next to but slightly spaced from the impurity region 17 in the p-type well layer 30a. A gate electrode 18 is formed through a not-shown insulating film on the semiconductor substrate 30 between the impurity region 17 and the impurity region 19. The row selection transistor 33 shown in FIG. 2 is made up of the impurity region 17, the impurity region 19, the gate electrode 18 and a channel region under the gate electrode 18.

The row selection line RW shown in FIG. 1 is connected to the gate electrode 18 of the row selection transistor 33. The output signal line OS shown in FIG. 1 is connected to the impurity region 19 of the row selection transistor 33. When the row selection transistor 33 is turned on, a signal outputted from the output transistor 32 is outputted to the output signal line OS.

Operation of the solid-state imaging device 100 configured as described above will be described. The solid-state imaging device 100 operates differently in accordance with the quantity of incident light based on the function of the separation/connection region 12 contained in the charge storage portion 10. Therefore, operation of the solid-state imaging device 100 will be described below separately when the quantity of incident light is small and when the quantity of incident light is large.

Figure 4:
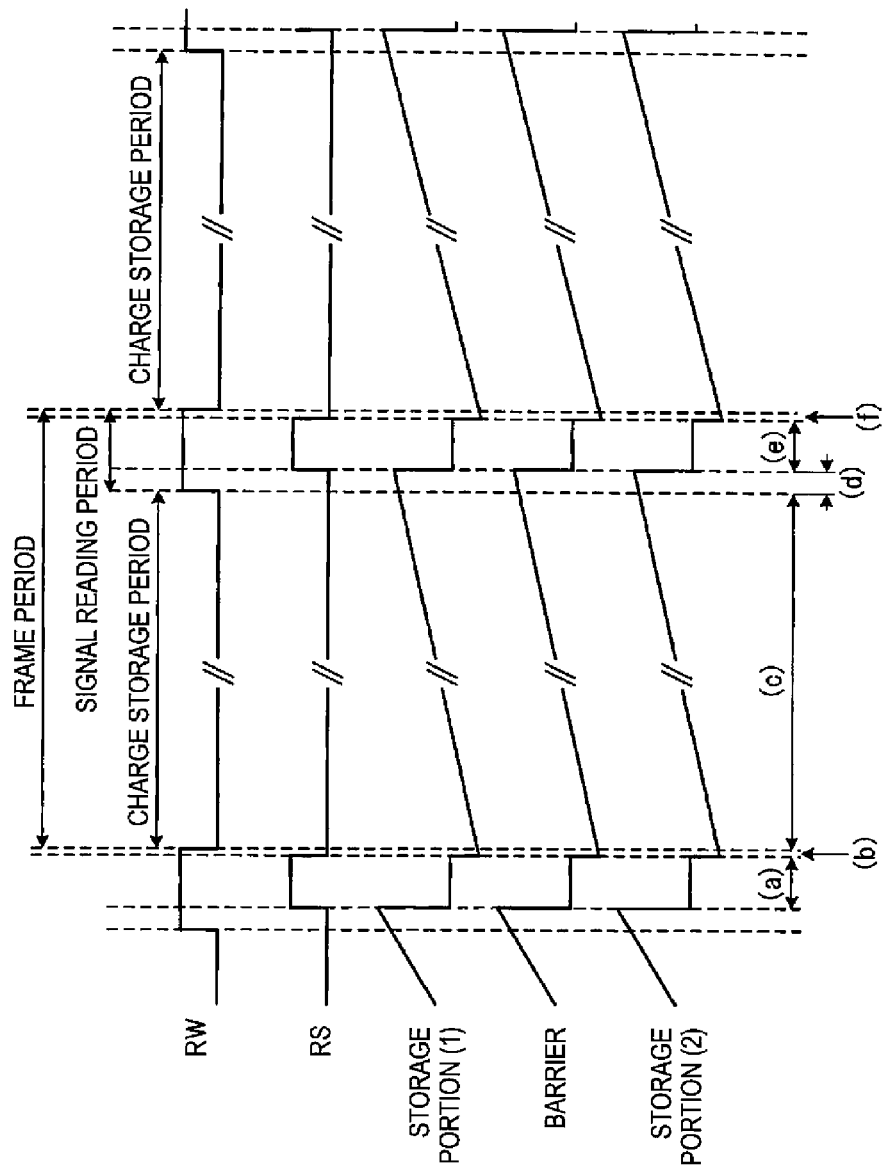
[FIG. 4] A timing chart for explaining imaging operation for one pixel row in the solid-state imaging device 100 shown in FIG. 1 (in the case where the quantity of incident light is small).

FIG. 4 is a timing chart for explaining imaging operation for one pixel row in the solid-state imaging device 100 shown in FIG. 1 (in the case where the quantity of incident light is small). In FIG. 4, "RW" designates a voltage waveform supplied to the row selection line RW, and "RS" designates a voltage waveform supplied to the reset line RS. "Storage portion (1)" designates the potential of the first charge storage region 11. "Barrier" designates the potential of the separation/connection region 12. "Storage portion (2)" designates the potential of the second charge storage region 13.

Figure 5:
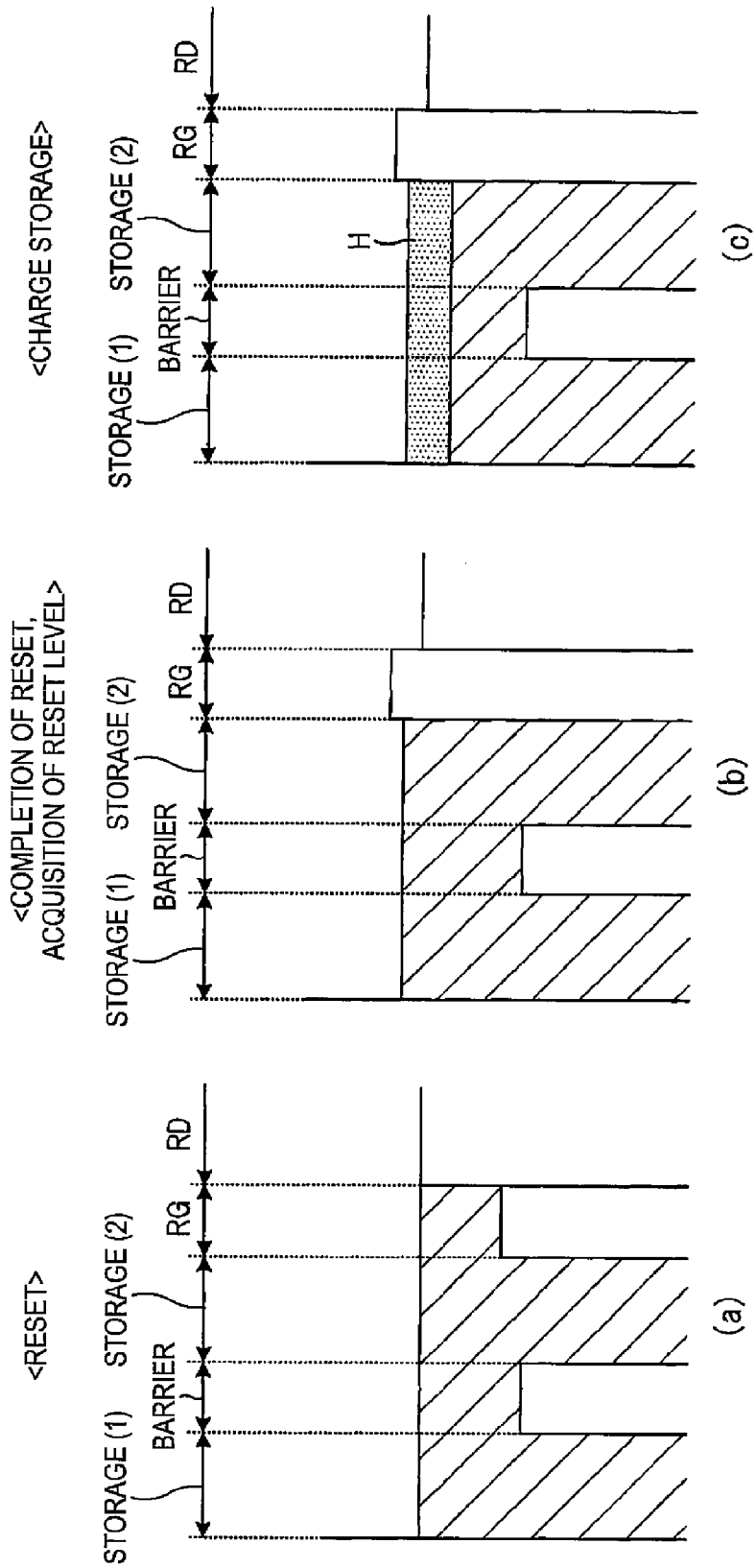
[FIG. 5] A view showing potential transition in a semiconductor substrate 30 during the imaging operation for one pixel row in the solid-state imaging device 100 shown in FIG. 1 (in the case where the quantity of incident light is small).
Figure 6:
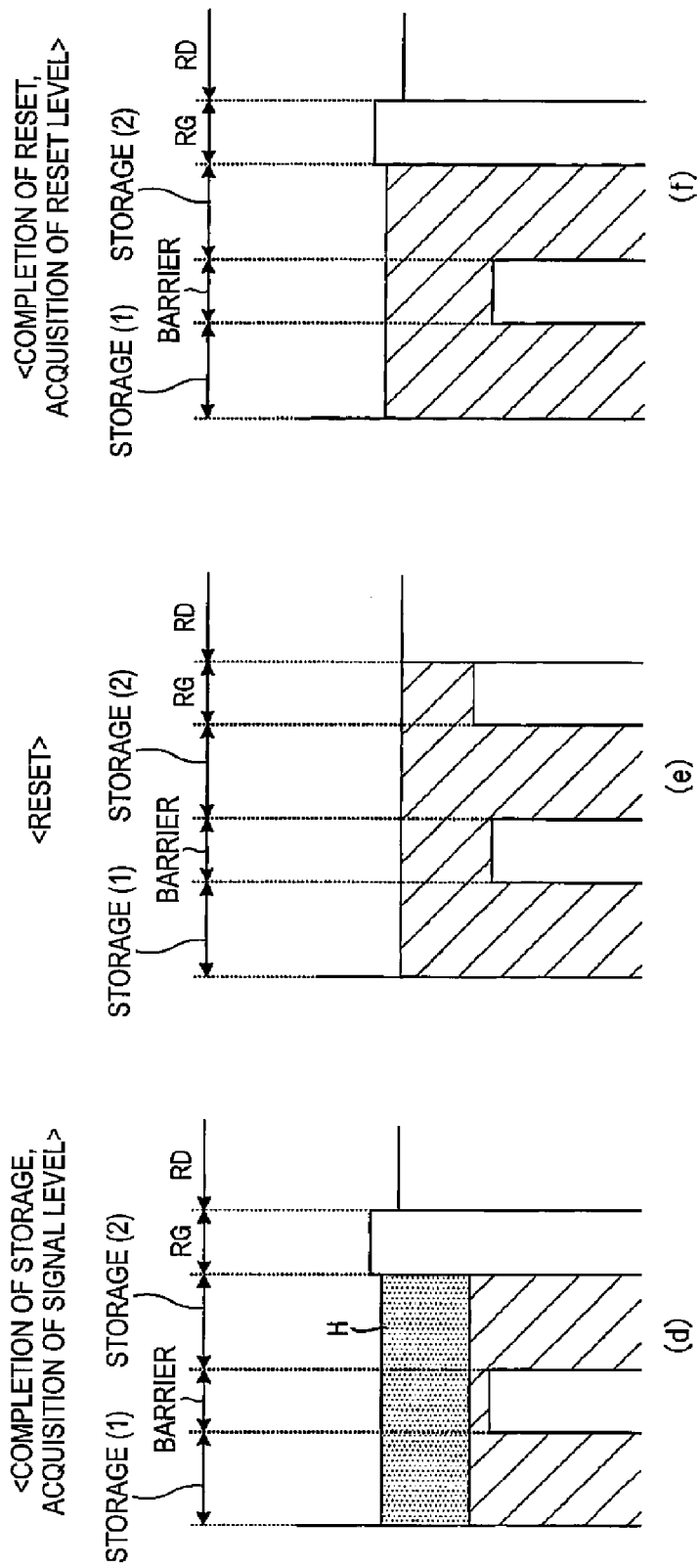
[FIG. 6] A view showing potential transition in the semiconductor substrate 30 during the imaging operation for one pixel row in the solid-state imaging device 100 shown in FIG. 1 (in the case where the quantity of incident light is small).

FIG. 5 and FIG. 6 are views showing potential transition in the semiconductor substrate 30 during the imaging operation for one pixel row in the solid-state imaging device 100 shown in FIG. 1 (in the case where the quantity of incident light is small). (a) to (c) of FIG. 5 and (d) to (f) of FIG. 6 are views of potential in the semiconductor substrate 30 in respective periods (a) to (f) shown in FIG. 4. In FIG. 5 and FIG. 6, "storage (1)" designates the potential of the first charge storage region 11. "Barrier" designates the potential of the separation/connection region 12. "Storage (2)" designates the potential of the second charge storage region 13. "RG" designates the potential of the channel region of the reset transistor 31. "RD" designates the potential of the impurity region 15 of the reset transistor 31. In addition, in FIG. 5 and FIG. 6, the potential becomes higher as the position goes downward.

During the operation, the solid-state imaging device 100 repeats a frame period (frame) which includes a charge storage period when electric charges are stored in the charge storage portion 10, and a signal reading period when a signal corresponding to the electric charges stored in the second charge storage region 13 of the charge storage portion 10 in the charge storage period is read out, as shown in FIG. 4.

Before start of the frame period, the scanning circuit 102 changes the voltage applied to the gate electrode 14 of the reset transistor 31 from a low level to a high level. A potential state during the reset is shown in FIG. 5(a). As shown in FIG. 5(a), when the voltage applied to the gate electrode 19 turns to the high level, the potential of the channel region of the reset transistor 31 becomes higher than the potential (reset potential) of the impurity region 15 of the reset transistor 31. As a result, electrons are injected from the impurity region 15 of the reset transistor 31 into the charge storage portion 10 to reset the potential of each of the first charge storage region 11, the separation/connection region 12 and the second charge storage region 13 to a reset potential.

Next, the scanning circuit 102 changes the voltage applied to the gate electrode 14 of the reset transistor 31 from the high level to the low level to complete the reset. A potential state after completion of the reset is shown in FIG. 5(b). As shown in FIG. 5(b), when the voltage applied to the gate electrode 14 turns to the low level, the potential of the channel region of the reset transistor 31 becomes shallower than the potential of the impurity region 15 of the reset transistor 31. On this occasion, the potential of the charge storage portion 10 becomes slightly shallower than in the case of FIG. 5(a) because of capacitive coupling.

After completion of the reset, a signal (reset signal) corresponding to the potential of the second charge storage region 13 in the state of FIG. 5(b) is outputted from the row selection transistor 33 to the output signal line OS. This signal is held as a reset signal contained in an imaging signal of a previous frame in the signal processing portion 103. Successively, a process of subtracting the reset signal from the imaging signal of the previous frame is performed by the signal processing portion 103. When the reset signal is outputted, the scanning circuit 102 turns off the row selection transistor 33.

The potential of the separation/connection region 12 is determined based on the power supply voltage VDD applied to the electrode 12a. As shown in FIGS. 5(a) and 5(b), the potential of the separation/connection region 12 is in a position deeper than the reset potential. Therefore, electrons injected from the impurity region 15 of the reset transistor 31 are also stored in the separation/connection region 12. Accordingly, during the reset and when the reset is completed, the potential of each of the first charge storage region 11, the separation/connection region 12 and the second charge storage region 13 becomes the same potential.

Since light always strikes against the photoelectric conversion portion P during imaging operation, the charge storage period starts after completion of the reset in FIG. 5(b). During the charge storage period, holes of the electric charges generated in the photoelectric conversion layer 22 move to the pixel electrode 21 and then move from the pixel electrode 21 to the first charge storage region 11. The first charge storage region 11, the separation/connection region 12 and the second charge storage region 13 are electrically conductive when the potential is lower than the potential of the separation/connection region 12 determined based on the power supply voltage VDD applied to the electrode 12a. Therefore, the holes having moved to the first charge storage region 11 are also stored in the separation/connection region 12 and the second charge storage region 13. Accordingly, the potential of each of the first charge storage region 11, the separation/connection region 12 and the second charge storage region 13 rises uniformly.

FIG. 5(c) is a view showing a potential state during the charge storage period. As shown in FIG. 5(c), holes H corresponding to the incident light are stored in the region (charge storage portion 10) including the first charge storage region 11, the separation/connection region 12 and the second charge storage region 13.

When it comes to timing to terminate the charge storage period, the scanning circuit 102 turns on the row selection transistor 33 (FIG. 4(d) and FIG. 6(d)). When the row selection transistor 33 is turned on, a signal (imaging signal) corresponding to the potential of the second charge storage region 13 is outputted from the output transistor 32 to the output signal line OS via the row selection transistor 33. The imaging signal is held in the signal processing portion 103.

Next, the scanning circuit 102 changes the voltage applied to the gate electrode 14 of the reset transistor 31 from the low level to the high level to reset the potential of the charge storage portion 10. A potential state during the reset is shown in FIG. 6(e). When the scanning circuit 102 returns the voltage applied to the gate electrode 14 of the reset transistor 31 to the low level, the reset is completed. The potential on this occasion is shown in FIG. 6(f). When the reset is completed, a signal (reset signal) corresponding to the potential of the second charge storage region 13 in the state of FIG. 6(f) is outputted from the row selection transistor 33 to the output signal line OS. This signal is held in the signal processing portion 103. After output of the reset signal, the scanning circuit 102 turns off the row selection transistor 33.

The signal processing portion 103 subtracts the reset signal held in FIG. 4(f) from the imaging signal held in FIG. 4(d) to obtain an imaging signal from which noise has been removed.

Figure 7:
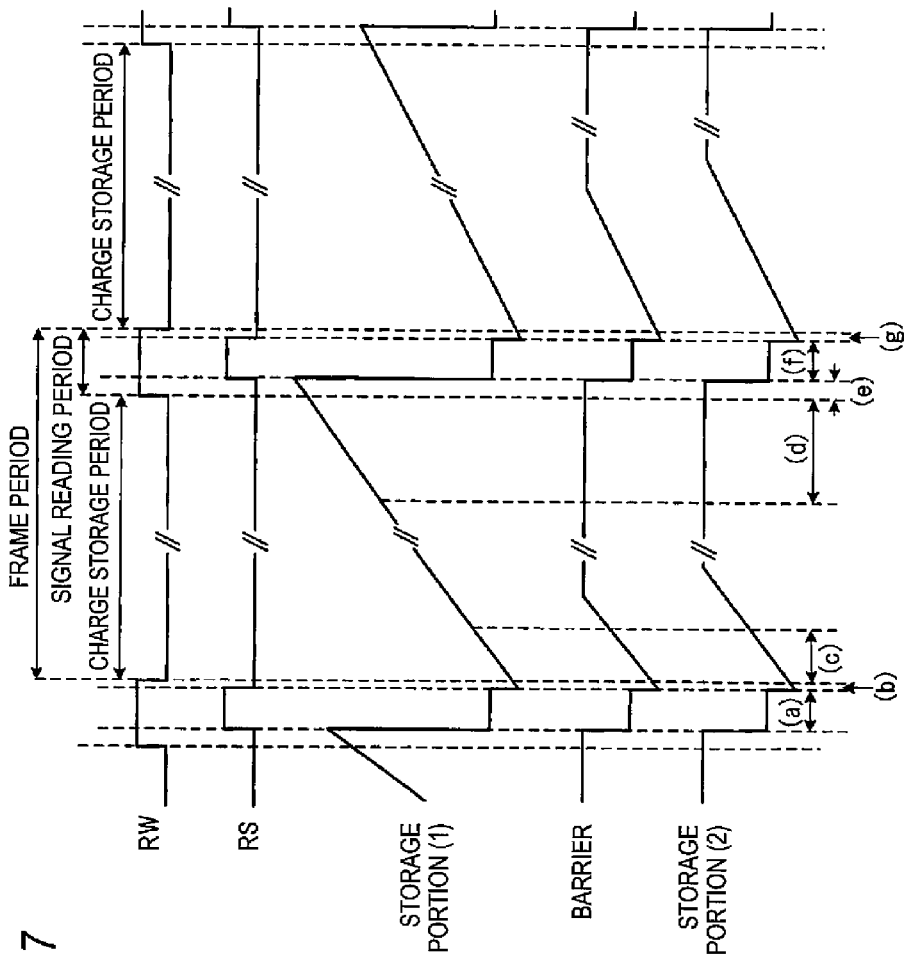
[FIG. 7] A timing chart for explaining imaging operation for one pixel row in the solid-state imaging device 100 shown in FIG. 1 (in the case where the quantity of incident light is large).

FIG. 7 is a timing chart for explaining imaging operation for one pixel row in the solid-state imaging device 100 shown in FIG. 1 (in the case where the quantity of incident light is large). Signs (RW, RS, storage portion (1), barrier, and storage portion (2)) in FIG. 7 are the same as those in FIG. 4.

Figure 8:
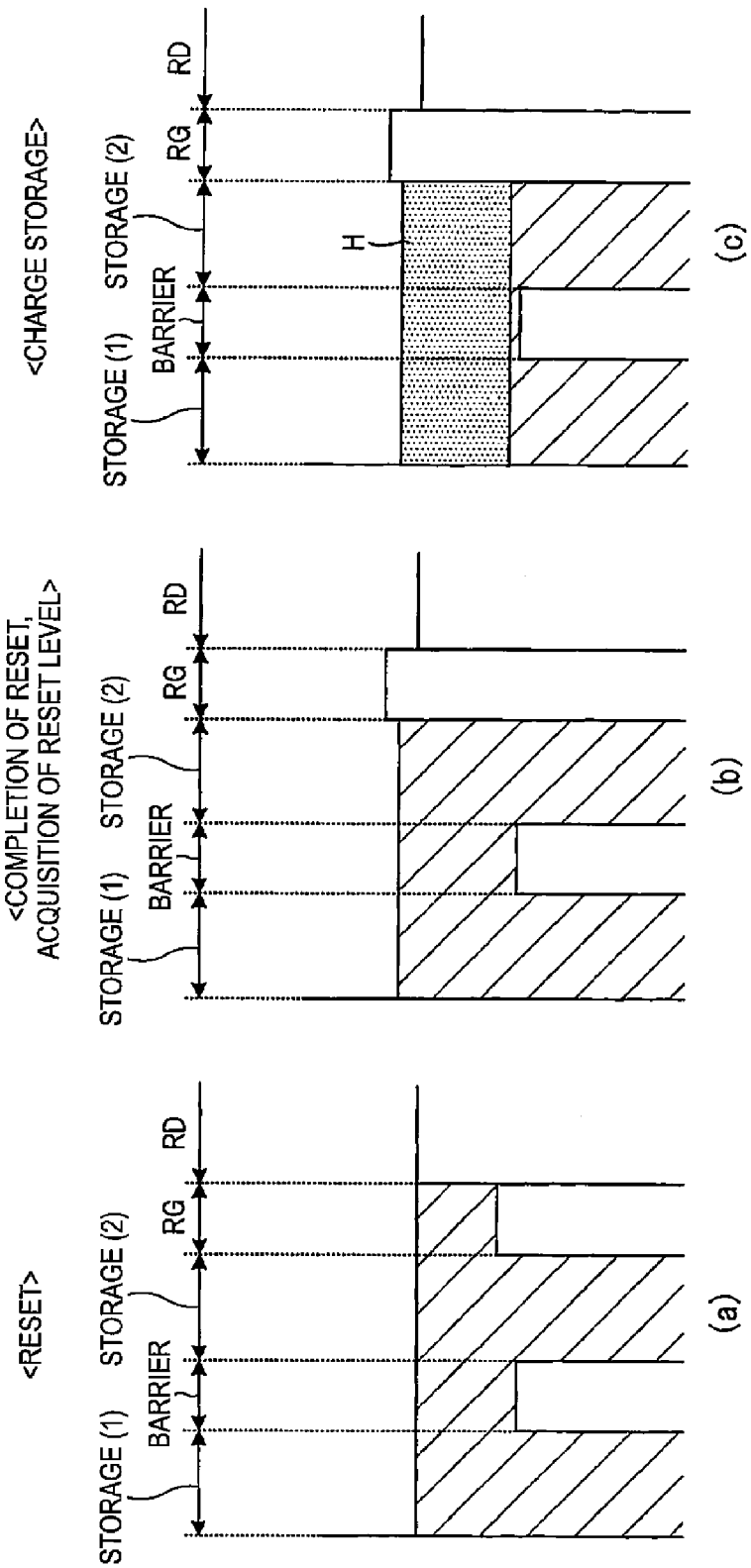
[FIG. 8] A view showing potential transition in the semiconductor substrate 30 during the imaging operation for one pixel row in the solid-state imaging device 100 shown in FIG. 1 (in the case where the quantity of incident light is large).
Figure 9:
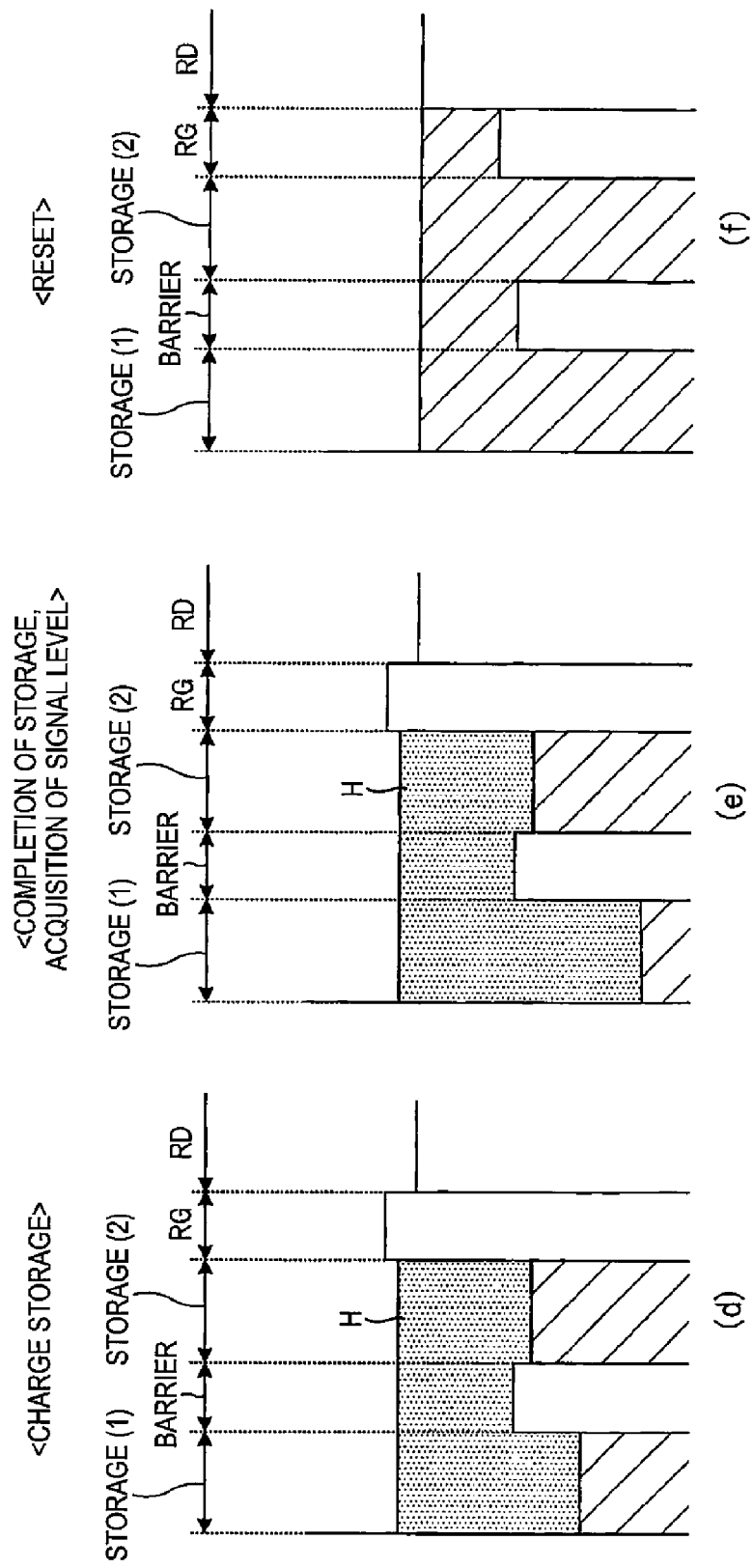
[FIG. 9] A view showing potential transition in the semiconductor substrate 30 during the imaging operation for one pixel row in the solid-state imaging device 100 shown in FIG. 1 (in the case where the quantity of incident light is large).
Figure 10:
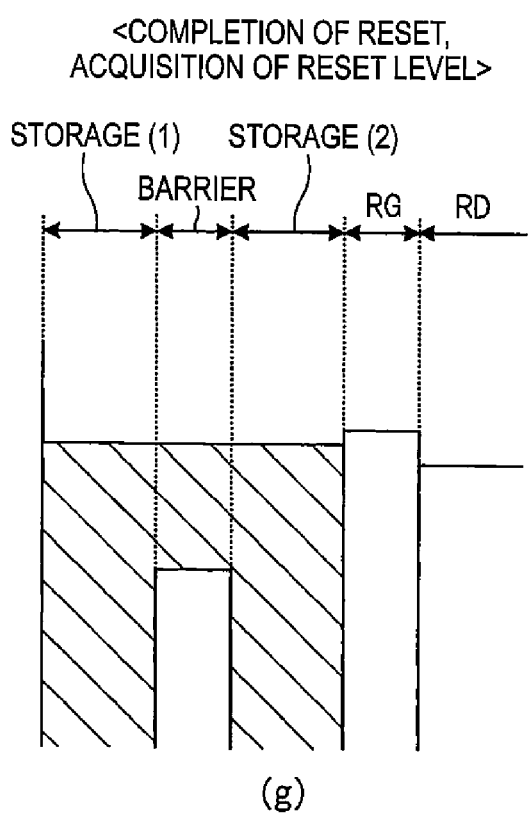
[FIG. 10] A view showing potential transition in the semiconductor substrate 30 during the imaging operation for one pixel row in the solid-state imaging device 100 shown in FIG. 1 (in the case where the quantity of incident light is large).

FIGS. 8 to 10 are views showing potential transition in the semiconductor substrate 30 during imaging operation for one pixel row in the solid-state imaging device 100 shown in FIG. 1 (in the case where the quantity of incident light is large). (a) to (c) of FIG. 8, (d) to (f) of FIG. 9 and (g) of FIG. 10 are views of potential in the semiconductor substrate 30 in respective periods (a) to (g) shown in FIG. 7. Signs (storage (1), barrier, storage (2), RG and RD) in FIGS. 8 to 10 are the same as those in FIGS. 5 and 6. In addition, in FIGS. 8 to 10, the potential becomes higher as the position goes downward.

Before start of the frame period, the scanning circuit 102 changes the voltage applied to the gate electrode 14 of the reset transistor 31 from the low level to the high level. A potential state during the reset is shown in FIG. 8(a).

Next, the scanning circuit 102 changes the voltage applied to the gate electrode 14 of the reset transistor 31 from the high level to the low level to complete the reset. A potential state after completion of the reset is shown in FIG. 8(b). As shown in FIG. 8(b), the potential of the charge storage portion 10 after completion of the reset becomes slightly shallower than in the case of FIG. 8(a) because of capacitive coupling.

After completion of the reset, a signal (reset signal) corresponding to the potential of the second charge storage region 13 in the state of FIG. 8(b) is outputted from the row selection transistor 33 to the output signal line OS. This signal is held as a reset signal contained in an imaging signal of a previous frame in the signal processing portion 103. A process for subtracting the reset signal from the imaging signal of the previous frame is performed by the signal processing portion 103. When the reset signal is outputted, the scanning circuit 102 turns off the row selection transistor 33.

Since light always strikes against the photoelectric conversion portion P during the imaging operation, a charge storage period starts after completion of the reset of FIG. 8(b). During the charge storage period, holes of the electric charges generated in the photoelectric conversion layer 22 move to the pixel electrode 21 and then move from the pixel electrode 21 to the first charge storage region 11. The first charge storage region 11, the separation/connection region 12 and the second charge storage region 13 are electrically conductive when the potential is not higher than the potential of the separation/connection region 12 determined based on the power supply voltage VDD applied to the electrode 12a. Therefore, the holes having moved to the first charge storage region 11 are also stored in the separation/connection region 12 and the second charge storage region 13. Accordingly, the potential of each of the first charge storage region 11, the separation/connection region 12 and the second charge storage region 13 rises uniformly.

FIG. 8(c) is a view showing a potential state during the charge storage period when the quantity of holes moved to the pixel electrode 21 is not larger than a threshold. As shown FIG. 8(c), holes H corresponding to the incident light are stored in the region (charge storage portion 10) including the first charge storage region 11, the separation/connection region 12 and the second charge storage region 13.

As shown in FIG. 9(d), when holes further move to the pixel electrode 21 so that the potential of each of the first charge storage region 11 and the second charge storage region 13 becomes higher than the potential (hereinafter referred to as barrier potential) of the separation/connection region 12 determined based on the power supply voltage VDD applied to the electrode 12a, the potential of the second charge storage region 13 is kept constant in a place slightly higher than the barrier potential and does not become higher than the constant value. This is because the current flowing into the second charge storage region 13 from the semiconductor substrate 30 balances with the current flowing out from the second charge storage region 13 to the first charge storage region 11 over the barrier potential.

Accordingly, when the potential of each of the first charge storage region 11 and the second charge storage region 13 becomes higher than the barrier potential, holes moved to the pixel electrode 21 are stored only in the first charge storage region 11. Only the potential of the first charge storage region 11 increases continuously up to about the same level as the bias voltage applied to the counter electrode 23 at maximum.

When it comes to timing to terminate the charge storage period, the scanning circuit 102 turns on the row selection transistor 33 (FIG. 7(e) and FIG. 9(e)). When the row selection transistor 33 is turned on, a signal (imaging signal) corresponding to the potential (potential slightly higher than the barrier potential) of the second charge storage region 13 is outputted from the output transistor 32 to the output signal line OS via the row selection transistor 33. This imaging signal is held in the signal processing portion 103.

Next, the scanning circuit 102 changes the voltage applied to the gate voltage 14 of the reset transistor 31 from the low level to the high level to reset the potential of the charge storage portion 10. A potential state during the reset is shown in FIG. 9(f). When the scanning circuit 102 returns the voltage applied to the gate voltage 14 of the reset transistor 31 to the low level, the rest is completed. The potential on this occasion is shown in FIG. 10(g). When the reset is completed, a signal (reset signal) corresponding to the potential of the second charge storage region 13 in the state of FIG. 10(g) is outputted from the row selection transistor 33 to the output signal line OS. This signal is held in the signal processing portion 103.

The signal processing portion 103 subtracts the reset signal held in FIG. 7(g) from the imaging signal held in FIG. 7(e) to thereby obtain an imaging signal from which noise has been removed.

As described above, according to the solid-state imaging device 100, when the quantity of holes stored in the charge storage portion 10 exceeds a predetermined quantity (the quantity of holes stored in the charge storage portion 10 when the potential of the second charge storage region 13 becomes the same as the barrier potential), holes are not stored any more in the second charge storage region 13 but holes are stored only in the first charge storage region 11. Therefore, even when excessive light is incident on the solid-state imaging device 100, the potential of the second charge storage region 13 can be prevented from becoming higher than a potential (value slightly higher than the barrier potential) which may cause breakdown of the second charge storage region 13.

Figure 11:
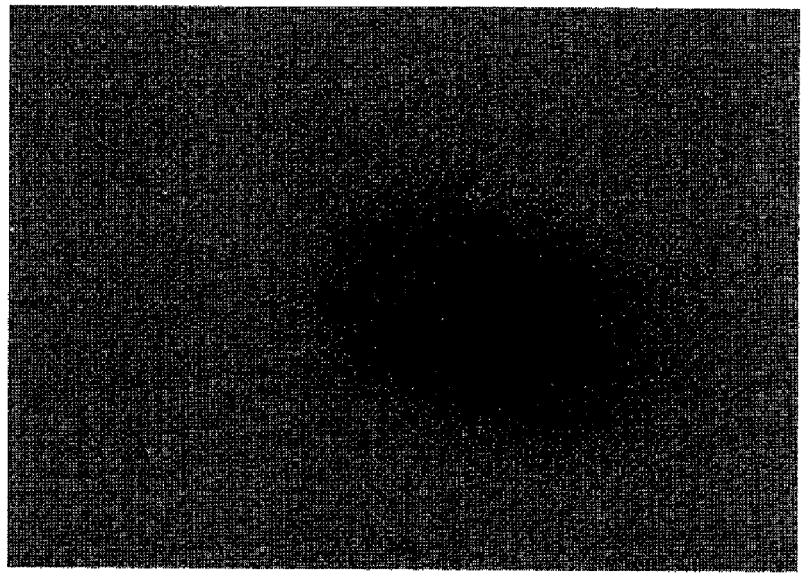
[FIG. 11] A view showing an image which is obtained when a solid-state imaging device having pixels each configured as shown in FIG. 14 and disposed in an array form is shielded from light to image dark after the sun is imaged by the solid-state imaging device.
Figure 12:
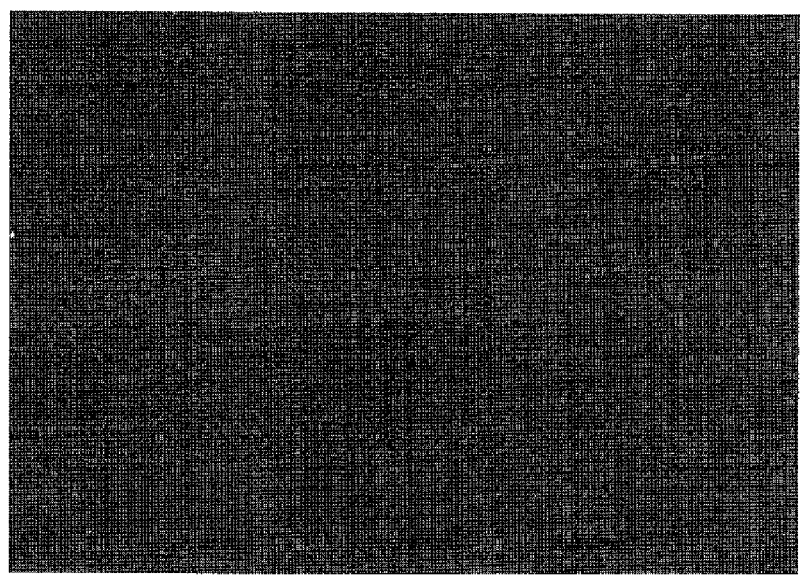
[FIG. 12] A view showing an image which is obtained when a solid-state imaging device having pixels each configured as shown in FIG. 2 and disposed in an array form is shielded from light to image dark after the sun is imaged by the solid-state imaging device.
Figure 14:
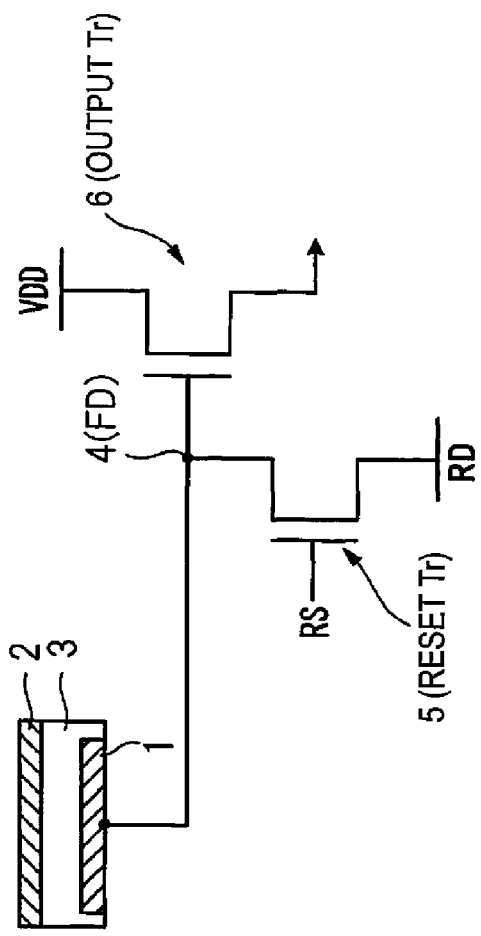
[FIG. 14] A view showing an example of a configuration of a one-pixel reading circuit in a photoelectric conversion layer stack type solid-state imaging device.

FIG. 11 is a view showing an image which is obtained when a solid-state imaging device having pixels each configured as shown in FIG. 14 and disposed in an array form is shielded from light to image dark after the sun is imaged by the solid-state imaging device. FIG. 12 is a view showing an, image which is obtained when a solid-state imaging device having pixels each configured as shown in FIG. 2 and disposed in an array form is shielded from light to image dark after the sun is imaged by the solid-state imaging device.

In the image shown in FIG. 11, black circular burn-in occurs in a position corresponding to the portion irradiated with the sunlight. On the contrary, in the image shown in FIG. 12, burn-in does not occur in any portion at all.

In the solid-state imaging device having pixels each configured as shown in FIG. 14, the potential of the floating diffusion 4 increases suddenly because of the very intensive sunlight so that the floating diffusion 4 is broken down and a dark current (electrons) increases suddenly in each pixel including the broken floating diffusion 4. In FIGS. 11 and 12, the case where holes are generated as a signal is indicated as white on the image. It is therefore conceived that a failure portion is expressed as black circular burn-in as shown in FIG. 11 because electrons increase suddenly due to a failure. On the other hand, according to the solid-state imaging device 100, the separation/connection region 12 suppresses great increase of the potential of the second charge storage region 13 so that a failure can be prevented from occurring. It is therefore conceived that a uniform output is obtained because burn-in as shown in FIG. 11 does not occur in FIG. 12.

Incidentally, any region can be used as the separation/connection region 12 as long as the separation/connection region 12 has a function of electrically separating the first charge storage region 11 and the second charge storage region 13 from each other in a deeper position than a predetermined potential (for example, power supply voltage VDD) but electrically connecting the first charge storage region 11 and the second charge storage region 13 to each other in a position of potential not higher than the predetermined potential. For example, as shown in FIG. 13, the separation/connection region 12 maybe made from an impurity region formed in the semiconductor substrate 30.

Figure 13:
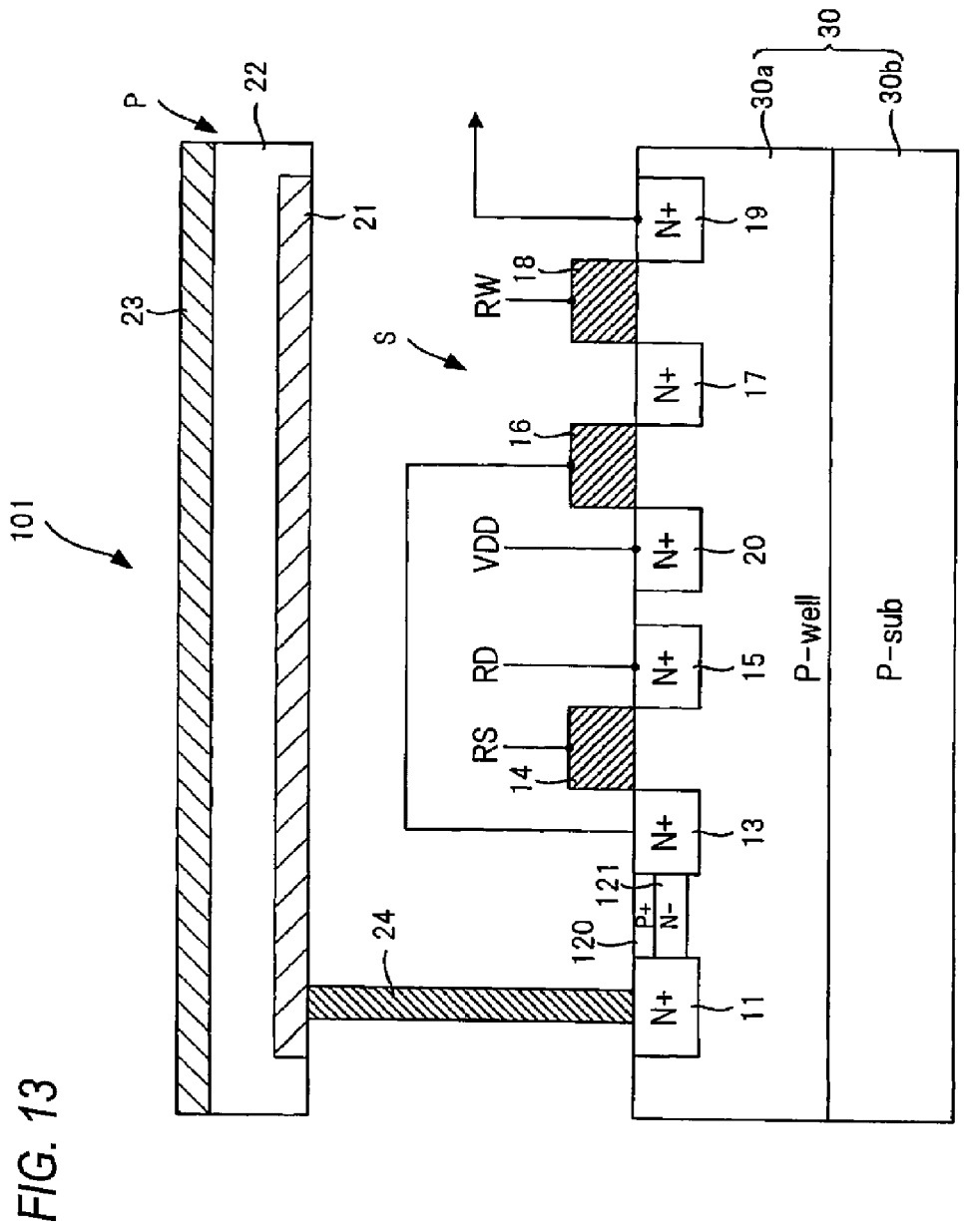
[FIG. 13] A view showing a modification of the solid-state imaging device 100 shown in FIG. 1.

FIG. 13 is a view showing a modification of the solid-state imaging device 100 shown in FIG. 1. FIG. 13 is a view corresponding to FIG. 3.

A pixel 101 shown in FIG. 13 has the same configuration as that of the pixel 101 shown in FIG. 3 except that the separation/connection region 12 and the electrode 12a are removed and a p-type impurity region 120 and an n-type impurity region 121 are added.

The n-type impurity region 121 is formed in the p-type well layer 30a between the first charge storage region 11 and the second charge storage region 13. The impurity concentration of the n-type impurity region 121 is lower than the impurity concentration of each of the first charge storage region 11 and the second charge storage region 13.

The p-type impurity region 120 is formed on a surface of the n-type impurity region 121. With such a configuration, the n-type impurity region 121 electrically separates the first charge storage region 11 and the second charge storage region 13 from each other when the potential is higher than a predetermined potential in the sectional potential of the semiconductor substrate 30, but the n-type impurity region 121 electrically connects the first charge storage region 11 and the second charge storage region 13 to each other when the potential is not higher than the predetermined potential in the sectional potential of the semiconductor substrate 30. That is, the n-type impurity region 121 functions as a separation/connection region. That is, the n-type impurity region 121 serves as a separation/connection region. In addition, because the p-type impurity region 120 is provided, an effect of dark current reduction or the like can be obtained.

In this manner, when the separation/connection region is made from an n-type impurity region 121, the electrode 12a for applying a fixed voltage can be dispensed with. Therefore, the number of wirings can be reduced and the pixels can be made fine compared with the pixel configuration of FIG. 3.

Incidentally, in this description, configuration is made so that electric charges collected from the photoelectric conversion portion P and stored in the floating diffusion 4 are holes and the signal reading circuit S is made by an n-channel MOS transistor. However, configuration may be made so that electric charges collected from the photoelectric conversion portion P are electrons and the signal reading circuit S is made by a p-channel MOS transistor. In this case, n-type and p-type in the solid-state imaging device described so far are reversed entirely. A value (for example, −10V) lower than a reference voltage GND (for example, 0V) serving as a reference for each potential and supplied to the signal reading circuit is applied to the counter electrode. Also in this configuration, the sectional potential of the substrate is as shown in FIGS. 5, 6 and 8 to 10. Incidentally, the potential becomes higher as the position goes upward in each drawing. Accordingly, the same effect as described above can be obtained.

As described above, the following items are disclosed in this description.

The disclosed solid-state imaging device is a solid-state imaging device in which pixels each including a photoelectric conversion portion formed above a semiconductor substrate and an MOS type signal reading circuit formed at the semiconductor substrate and provided for reading a signal corresponding to electric charges generated in the photoelectric conversion portion are disposed in an array form, wherein: the photoelectric conversion portion includes a pixel electrode formed above the semiconductor substrate so as to be split in accordance with each of the pixels, a counter electrode formed above the pixel electrode, and a photoelectric conversion layer formed between the pixel electrode and the counter electrode; a bias voltage higher than a power supply voltage of the signal reading circuit is applied to the counter electrode so that holes of the electric charges generated in the photoelectric conversion layer move to the pixel electrode; the signal reading circuit includes a charge storage portion which is formed in the semiconductor substrate and in which the holes moved to the pixel electrode are stored, an output transistor which outputs a signal corresponding to the potential of the charge storage portion, and a reset transistor which is provided for resetting the potential of the charge storage portion to a predetermined reset potential; the charge storage portion includes a first charge storage region made from an n-type impurity region electrically connected to the pixel electrode, a second charge storage region made from an n-type impurity region formed next to but spaced from the first charge storage region, and a separation/connection region which electrically separates the first charge storage region and the second charge storage region from each other when the potential is higher than a predetermined potential in a sectional potential but which electrically connects the first charge storage region and the second charge storage region to each other when the potential is not higher than the predetermined potential in the sectional potential; holes moved from the pixel electrode are stored in each of the first charge storage region, the second charge storage region and the separation/connection region till the quantity of holes moved to the pixel electrode reaches a predetermined quantity, but holes moved from the pixel electrode are stored only in the first charge storage region when the quantity of holes moved to the pixel electrode exceeds the predetermined quantity; and the output transistor outputs a signal corresponding to the potential of the second charge storage region.

In the disclosed solid-state imaging device, the predetermined potential is higher than the reset potential.

The disclosed solid-state imaging device is a solid-state imaging device in which pixels each including a photoelectric conversion portion formed above a semiconductor substrate and an MOS type signal reading circuit formed at the semiconductor substrate and provided for reading a signal corresponding to electric charges generated in the photoelectric conversion portion are disposed in an array form, wherein: the photoelectric conversion portion includes a pixel electrode formed above the semiconductor substrate so as to be split in accordance with each of the pixels, a counter electrode formed above the pixel electrode, and a photoelectric conversion layer formed between the pixel electrode and the counter electrode; a bias voltage lower than a reference voltage of the signal reading circuit is applied to the counter electrode so that electrons of the electric charges generated in the photoelectric conversion layer move to the pixel electrode; the signal reading circuit includes a charge storage portion which is formed in the semiconductor substrate and in which the electrons moved to the pixel electrode are stored, an output transistor which outputs a signal corresponding to the potential of the charge storage portion, and a reset transistor which is provided for resetting the potential of the charge storage portion to a predetermined reset potential; the charge storage portion includes a first charge storage region made from a p-type impurity region electrically connected to the pixel electrode, a second charge storage region made from a p-type impurity region formed next to but spaced from the first charge storage region, and a separation/connection region which electrically separates the first charge storage region and the second charge storage region from each other when the potential is lower than a predetermined potential in a sectional potential but which electrically connects the first charge storage region and the second charge storage region to each other when the potential is not lower than the predetermined potential in the sectional potential; electrons moved from the pixel electrode are stored in each of the first charge storage region, the second charge storage region and the separation/connection region till the quantity of electrons moved to the pixel electrode reaches a predetermined quantity, but electrons moved from the pixel electrode are stored only in the first charge storage region when the quantity of electrons moved to the pixel electrode exceeds the predetermined quantity; and the output transistor outputs a signal corresponding to the potential of the second charge storage region.

In the disclosed solid-state imaging device, the predetermined potential is lower than the reset potential.

In the disclosed solid-state imaging device, the separation/connection region is made by a gate electrode which is formed over the semiconductor substrate between the first charge storage region and the second charge storage region and to which a fixed voltage is applied.

The disclosed solid-state imaging device includes a device in which the fixed voltage is the power supply voltage.

The disclosed solid-state imaging device includes a device in which the fixed voltage is the reference voltage.

In the disclosed solid-state imaging device, the separation/connection region is made from an impurity region formed between the first charge storage region and the second charge storage region in the semiconductor substrate.

In the disclosed solid-state imaging device, the impurity region is of the same conductivity type as that of each of the first charge storage region and the second charge storage region, and the impurity concentration of the impurity region is lower than that of each of the first charge storage region and the second charge storage region.

In the disclosed solid-state imaging device, another impurity region of a conductivity type reverse to that of the impurity region is provided on a surface of the impurity region.

The disclosed imaging apparatus includes the solid-state imaging device.

INDUSTRIAL APPLICABILITY

According to the invention, it is possible to provide a photoelectric conversion layer stack type solid-state imaging device in which there is no failure even when excessive light is incident on the solid-state imaging device, and an imaging apparatus having the photoelectric conversion layer stack type solid-state imaging device.

Although the invention has been described in detail or with reference to a specific embodiment, it is obvious to those skilled in the art that various changes and modifications may be made without departing from the spirit and scope of the invention.

EXPLANATIONS OF REFERENCE SIGNS 100 solid-state imaging device
101 pixel
10 charge storage portion
11 first charge storage region
12 separation/connection region
13 second charge storage region
21 pixel electrode
22 photoelectric conversion layer
23 counter electrode
30 semiconductor substrate
31 reset transistor
32 output transistor

The invention claimed is:

1. A solid-state imaging device in which pixels each comprising a photoelectric conversion portion formed above a semiconductor substrate and an MOS type signal reading circuit formed at the semiconductor substrate and provided for reading out a signal corresponding to electric charges generated in the photoelectric conversion portion are disposed in an array form, wherein:

the photoelectric conversion portion comprises a pixel electrode formed above the semiconductor substrate so as to be split in accordance with each of the pixels, a counter electrode formed above the pixel electrode, and a photoelectric conversion layer formed between the pixel electrode and the counter electrode;

a bias voltage higher than a power supply voltage of the signal reading circuit is applied to the counter electrode so that holes of the electric charges generated in the photoelectric conversion layer move to the pixel electrode;

the signal reading circuit comprises a charge storage portion which is formed in the semiconductor substrate and in which the holes moved to the pixel electrode are stored, an output transistor which outputs a signal corresponding to the potential of the charge storage portion, and a reset transistor which is provided for resetting the potential of the charge storage portion to a predetermined reset potential;

the charge storage portion comprises a first charge storage region made from an n-type impurity region electrically connected to the pixel electrode, a second charge storage region made from an n-type impurity region formed next to but spaced from the first charge storage region, and a separation/connection region which electrically separates the first charge storage region and the second charge storage region from each other when the potential is higher than a predetermined potential in a sectional potential but which electrically connects the first charge storage region and the second charge storage region to each other when the potential is not higher than the predetermined potential in the sectional potential; holes moved from the pixel electrode are stored in each of the first charge storage region, the second charge storage region and the separation/connection region till the quantity of holes moved to the pixel electrode reaches a predetermined quantity, but holes moved from the pixel electrode are stored only in the first charge storage region when the quantity of holes moved to the pixel electrode exceeds the predetermined quantity; and the output transistor outputs a signal corresponding to the potential of the second charge storage region.

2. The solid-state imaging device according to claim 1, wherein the predetermined potential is higher than the reset potential.

3. The solid-state imaging device according to claim 1, wherein the separation/connection region is made by a gate electrode which is formed over the semiconductor substrate between the first charge storage region and the second charge storage region and to which a fixed voltage is applied.

4. The solid-state imaging device according to claim 3, wherein the fixed voltage is the power supply voltage.

5. The solid-state imaging device according to claim 1, wherein the separation/connection region is made by an impurity region formed between the first charge storage region and the second charge storage region in the semiconductor substrate.

6. The solid-state imaging device according to claim 5, wherein:

the impurity region is of the same conductivity type as that of each of the first charge storage region and the second charge storage region; and impurity concentration of the impurity region is lower than that of each of the first charge storage region and the second charge storage region.

7. The solid-state imaging device according to claim 6, wherein another impurity region of a conductivity type reverse to that of the impurity region is provided on a surface of the impurity region.

8. A solid-state imaging device in which pixels each comprising a photoelectric conversion portion formed above a semiconductor substrate and an MOS type signal reading circuit formed at the semiconductor substrate and provided for reading out a signal corresponding to electric charges generated in the photoelectric conversion portion are disposed in an array form, wherein:

the photoelectric conversion portion comprises a pixel electrode formed above the semiconductor substrate so as to be split in accordance with each of the pixels, a counter electrode formed above the pixel electrode, and a photoelectric conversion layer formed between the pixel electrode and the counter electrode;

a bias voltage lower than a reference voltage of the signal reading circuit is applied to the counter electrode so that electrons of the electric charges generated in the photoelectric conversion layer move to the pixel electrode;

the signal reading circuit comprises a charge storage portion which is formed in the semiconductor substrate and in which the electrons moved to the pixel electrode are stored, an output transistor which outputs a signal corresponding to the potential of the charge storage portion, and a reset transistor which is provided for resetting the potential of the charge storage portion to a predetermined reset potential;

the charge storage portion comprises a first charge storage region made from a p-type impurity region electrically connected to the pixel electrode, a second charge storage region made from a p-type impurity region formed next to but spaced from the first charge storage region, and a separation/connection region which electrically separates the first charge storage region and the second charge storage region from each other when the potential is lower than a predetermined potential in a sectional potential but which electrically connects the first charge storage region and the second charge storage region to each other when the potential is not lower than the predetermined potential in the sectional potential, electrons moved from the pixel electrode are stored in each of the first charge storage region, the second charge storage region and the separation/connection region till the quantity of electrons moved to the pixel electrode reaches a predetermined quantity, but electrons moved from the pixel electrode are stored only in the first charge storage region when the quantity of electrons moved to the pixel electrode exceeds the predetermined quantity; and the output transistor outputs a signal corresponding to the potential of the second charge storage region.

9. The solid-state imaging device according to claim 8, wherein the predetermined potential is lower than the reset potential.

10. The solid-state imaging device according to claim 8, wherein the separation/connection region is made by a gate electrode which is formed over the semiconductor substrate between the first charge storage region and the second charge storage region and to which a fixed voltage is applied.

11. The solid-state imaging device according to claim 10, wherein the fixed voltage is the reference voltage.

12. The solid-state imaging device according to claim 8, wherein the separation/connection region is made by an impurity region formed between the first charge storage region and the second charge storage region in the semiconductor substrate.

13. The solid-state imaging device according to claim 12, wherein:
  the impurity region is of the same conductivity type as that of each of the first charge storage region and the second charge storage region; and
  impurity concentration of the impurity region is lower than that of each of the first charge storage region and the second charge storage region.

14. The solid-state imaging device according to claim 13, wherein another impurity region of a conductivity type reverse to that of the impurity region is provided on a surface of the impurity region.

15. An imaging apparatus comprising the solid-state imaging device according to claim 1.

16. An imaging apparatus comprising the solid-state imaging device according to claim 8.

* * * * *